United States Patent
Joslin et al.

[11] Patent Number: 6,069,679
[45] Date of Patent: May 30, 2000

[54] SELECTIVE CALL RECEIVER HAVING A DISPLAY MODULE WITH INTEGRATED CIRCUITS AND METHOD THEREFOR

[75] Inventors: Scott Joslin, Boynton Beach; Douglas Wayne Hendricks, Gulfstream, both of Fla.; Frank Juskey, Phoenix, Ariz.

[73] Assignee: Motorola, Inc., Schaumburg, Ill.

[21] Appl. No.: 08/929,004

[22] Filed: Sep. 4, 1997

[51] Int. Cl.$^7$ .......................... G02F 1/1345; H01R 9/09
[52] U.S. Cl. ..................... 349/149; 349/150; 349/152; 439/67
[58] Field of Search .................... 349/149, 150, 349/151, 152; 439/67, 77, 83

[56] References Cited

U.S. PATENT DOCUMENTS

| | | | |
|---|---|---|---|
| 4,127,321 | 11/1978 | Koyama et al. | 349/152 |
| 4,722,100 | 2/1988 | Suenaga | 350/336 |
| 5,142,644 | 8/1992 | Van Steenkiste et al. | 349/152 |
| 5,528,403 | 6/1996 | Kawaguchi et al. | 349/149 |
| 5,644,326 | 7/1997 | Lauzon et al. | 345/34 |
| 5,726,726 | 3/1998 | Nakanishi | 349/149 |
| 5,777,705 | 7/1998 | Pierson et al. | 349/149 |
| 5,818,561 | 10/1998 | Nakanishi | 349/149 |
| 5,847,796 | 12/1998 | Uchiyama et al. | 349/149 |
| 5,893,623 | 4/1999 | Muramatsu | 349/152 |

OTHER PUBLICATIONS

Densitron International PLC, *Chip on Glass (COG) Technology,* Densitron Novel Engineering Worldwide Solutions, 1997.

*Primary Examiner*—William L. Sikes
*Assistant Examiner*—Tarifur R. Chowdhury

[57] ABSTRACT

A display module (207) is used that integrates circuit components (402–422) thereto. The display module (207) includes a displayable element (101), and a first conductive runner (206) located on a backside of the display module (207) that couples to the displayable element (101). Additionally, display module (207) includes at least one layer of substrate material (208, 210) covering the backside of the display module (207) with a portion of the first conductive runner (206) exposed, and a first conductive coupling element (212, 302) coupled to the portion of the first conductive runner (206).

19 Claims, 5 Drawing Sheets

SELECTIVE CALL RECEIVER HAVING A DISPLAY MODULE WITH INTEGRATED CIRCUITS AND METHOD THEREFOR

FIELD OF THE INVENTION

This invention relates in general to selective call receivers, and specifically to a selective call receiver including a display module with attached circuits.

BACKGROUND OF THE INVENTION

FIG. 1 shows a front view of a conventional display module 107. The display module 107 comprises displayable elements 101 which together make a digit of seven displayable elements 101. Each displayable element 101 is coupled to a conductive runner 106 generally composed of indium tin oxide, which substantially makes the conductive runners 106 invisible to a user (note for illustration the conductive runners 106 are only shown for a single digit). Each digit is displayed within a displayable region 103. When using display modules 107 in consumer products the region of the display module 107 outside of the displayable region 103 is enclosed by, for example, a plastic housing (not shown).

FIG. 2 shows a perspective view of a backside of the display module 107 of FIG. 1. From this view, details of the display module 107 become evident. In its simplest form, the display module 107 comprises front and back plates 102, 105 holding between them conventional liquid crystal material 104. The front and back plates 102, 105 are generally constructed of see-through material such as glass. The liquid crystal material 104 has the property of enhancing the visibility of a displayable element 101 when activated electrically. To further enhance the visibility of the displayable element 101, a display enhancement panel 113 is appended to the back plate 105. The display enhancement panel 113 is generally either a conventional reflector or conventional electro-luminescent panel which substantially enhances the visibility of the displayable elements 101 while active.

The displayable elements 101 are activated by an external electrical source which couples to one of the conductive runners 106. Generally, to get access to the conductive runners 106, the length of the back plate 105 is shorter than the length of the front plate 102, thereby exposing the indium tin oxide runners 106. Under conventional manufacturing methods, these runners 106 are coupled to a PCB (printed circuit board) by way of, for example, a conventional heat seal connector. This method, although effective has several drawbacks.

First, heat seal connectors are constructed of a flexible substrate that is susceptible to tears from stresses. For example, during the manufacturing process of a consumer product such as a pager, each end of a heat seal connector is attached to a PCB and a display. The two devices are then inserted into a plastic enclosure that houses them. The insertion process is in many cases handled by a human operator, which during the handling process may add stresses to the heat seal connector, thereby causing tears. To remedy the tear, the heat seal must be removed, and replaced, causing the manufacturing process to slow down- consequently adding cost to the product. Yet another drawback is the increased volume necessary for housing the display module and PCB. Because of this volume, compactness of a consumer product is limited.

Accordingly, what is needed is a display module that overcomes the foregoing disadvantages described in the prior art.

BRIEF DESCRIPTION OF THE DRAWINGS

The present invention is pointed out with particularity in the appended claims. However, other features of the invention will become more apparent and best understood by referring to the following detailed description in conjunction with the accompanying drawings in which:

DESCRIPTION OF THE PREFERRED EMBODIMENT

Figure 1:
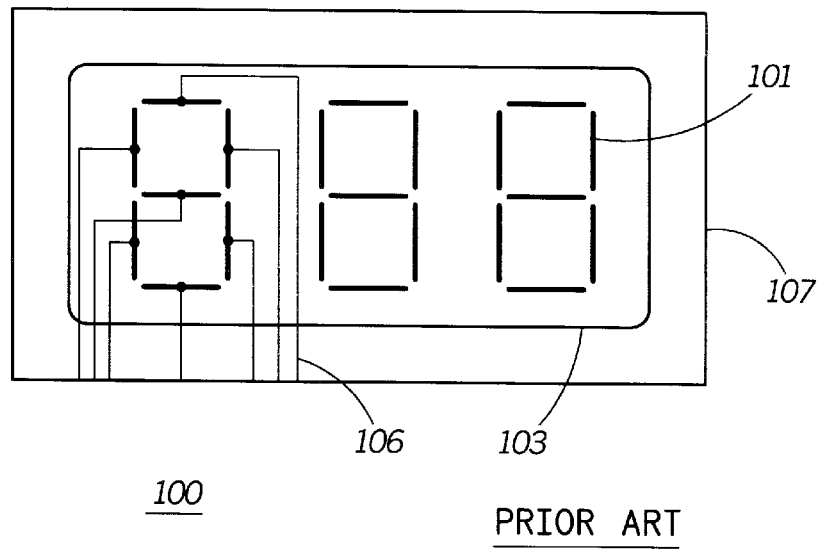
FIG. 1 shows a front view of a conventional display module.
Figure 2:
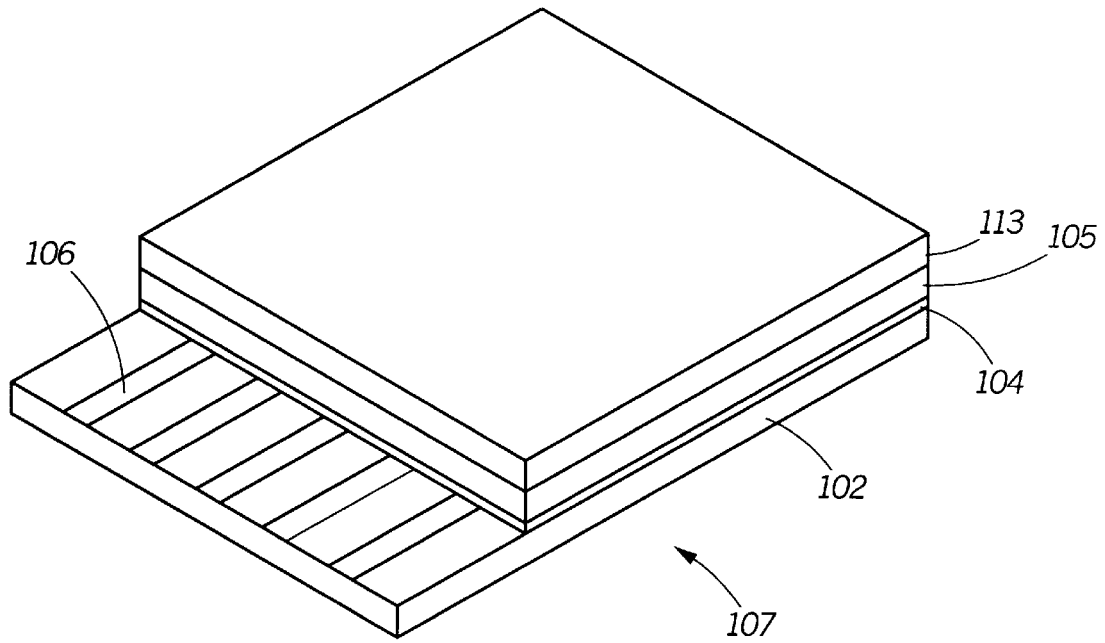
FIG. 2 shows a perspective view of a backside of the display module of FIG. 1.
Figure 3:
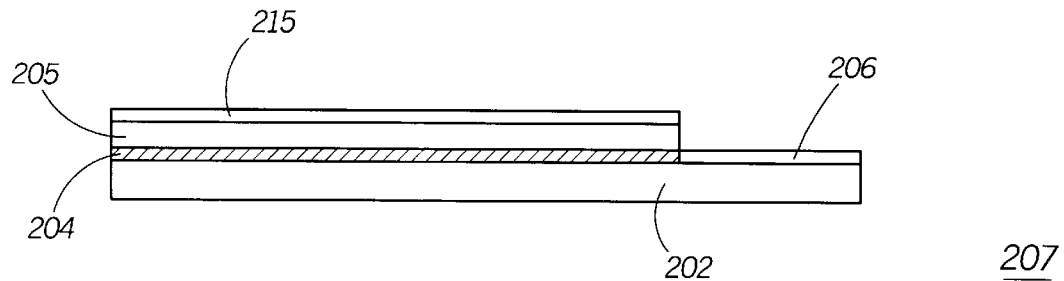
FIG. 3 shows a cross-sectional view of a display module according to the present invention.

FIG. 3 shows a cross-sectional view of a display module 207 according to the present invention. The display module 207 comprises front and back plates 202, 205, liquid crystal material 204 coupled between them, conductive runners 206 coupled to the displayable elements (not shown), and a panel 215 for enhancing the visibility of the displayable elements. Preferably, the back plate 105 is shorter than the front plate to expose the conductive runners 206 made of, e.g., indium tin oxide.

Figure 4:
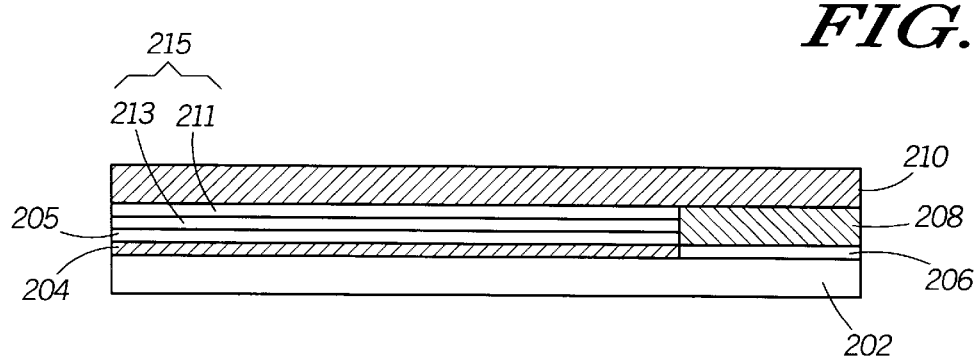
FIG. 4 shows a cross-sectional view of a muli-layered substrate added to the display module of FIG. 3, which when completed allows for mechanical and electrical coupling of circuit components to the display module according to the present invention.

To improve the reliability of the connection between display modules 207 and PCB's (not shown) and further optimize the compactness of consumer products utilizing display modules 207, the present invention integrates conventional PCB manufacturing techniques with the manufacture of the display module 207. FIG. 4 shows a cross-sectional view of a multi-layered substrate added to the display module 207, which when completed allows for mechanical and electrical coupling of circuit components to the display module 207 according to the present invention.

The panel 215 comprises a display enhancement panel 213 and a receptor panel 211. Generally, conventional display enhancement panels 213, such as reflective or an electro-luminescent panels, are not adequate receptacles for adding a substrate (such as polyimide) thereto. To overcome this problem, the receptor panel 211 is added to the display enhancement panel 213 to serve as an adequate receptor for receiving substrate material deposit and to also protect the display enhancement panel 213 from damage. The receptor panel 211 is, for example, a glass panel glued onto the enhancement panel 213. It will be appreciated that, alternatively, other types of receptor panels 211 suitable to the present invention for receiving substrate material and for protecting the display enhancement panel 213 may be used. It will also be appreciated that, alternatively, the receptor panel 211 may be eliminated by utilizing a display enhancement panel 213 that is not susceptible to damage. For example, a display enhancement panel 213 may be constructed using a layer of reflective paint that serves as an adequate reflector and that adheres well to conventional substrates deposited thereon.

Because the front and back plates 202, 205 are of different lengths, in a first embodiment a two step process is necessary to create a planar substrate surface on the backside of the display module 207. In the first step, a first layer of substrate material 208 is deposited on the portion of the front plate 202 that exposes the conductive runners 206. After this step, the panel 215 and the first layer of substrate material 208 are substantially planar to each other. A second layer of substrate material 210 is then added to the entire back surface of the display module 207. With both layers of substrate material 208, 210 in place, only a few more process steps are necessary for mechanically and electrically coupling a circuit component to the display module 207.

Figure 5:
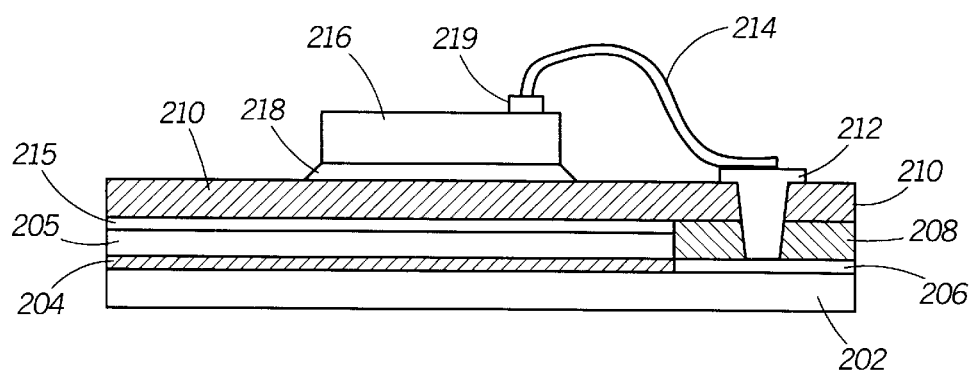
FIG. 5 shows a cross-sectional view of a circuit component wire bonded to a conductive pad that couples to a conductive runner of the display module according to the present invention.

FIG. 5 shows a cross-sectional view of the display module 207 with integrated circuits coupled thereto according to the present invention. Particularly, a circuit component 216 (e.g., a die) is wire bonded to a first conductive pad 212 that couples to the conductive runner 206 of the display module 207. The conductive pad 212 is constructed by removing a portion of the first and second layers of substrate material 208, 210 using conventional means (e.g., plasma or chemical etching), thereby exposing a portion of the conductive runner 206. Thereafter, copper, for example, is deposited in the cavity to form the conductive pad 212 which electrically couples to conductive runner 206. The circuit component 216 is then attached to the second layer of substrate material 210 with an adhering material 218 such as an epoxy compound. A wire 214 is then conventionally bonded to a second conductive pad 219 of the circuit component 216 and to the first conductive pad 212.

Figure 6:
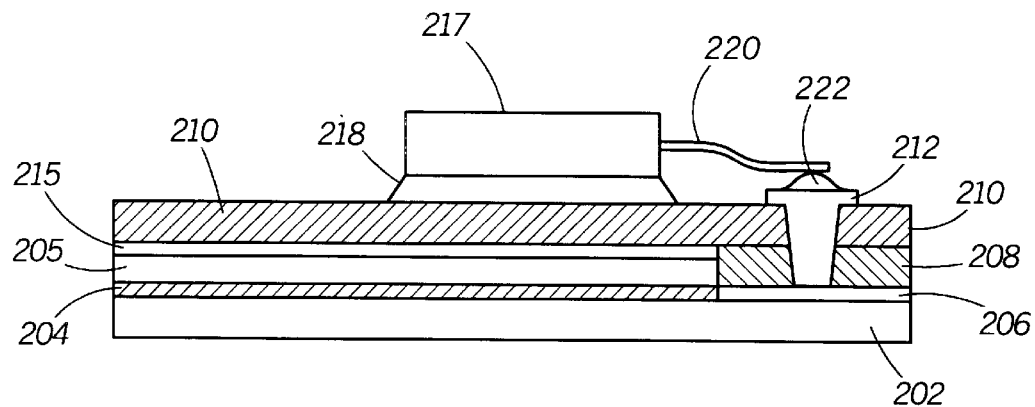
FIG. 6 shows a cross-sectional view of an alternative embodiment of FIG. 5, whereby a surface mount component is coupled to the conductive pad according to the present invention.

FIG. 6 shows a cross-sectional view of an alternative embodiment of FIG. 5, whereby a surface mount component 217 is coupled to the first conductive pad 212 according to the present invention. As with the embodiment shown in FIG. 5, the surface mount component 217 is coupled to the second layer of substrate material 210 with epoxy. However, a conductive pin 220 of the surface mount component 217 is coupled to the conductive pad 212 with a conductive adhesive 222, which is preferably cured in a conventional oven until the conductive pin 220 and the first conductive pad 212 have made an adequate electrical bond.

Figure 7:
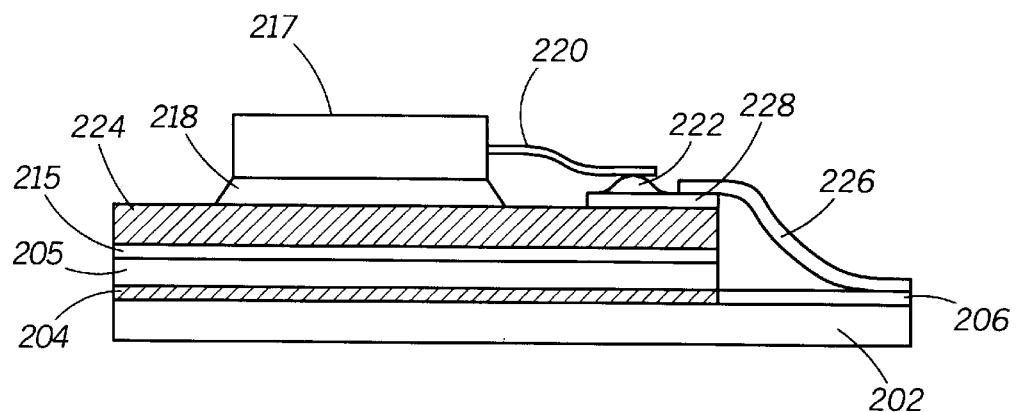
FIG. 7 shows a cross-sectional view of a surface mount component coupled to a conductive runner that in turn couples to one end of a heat seal connector, and whereby the opposite end of the heat seal connector couples to a conductive runner of the display module according to the present invention.

FIG. 7 shows yet another embodiment according to the present invention. In this embodiment, a cross-sectional view is shown of a heat seal connector 226 that couples the conductive pin 220 of the surface mount component 217 to one of the conductive runners 206 of the display module 207. This embodiment is accomplished with a single layer of substrate material 224 rather than two layers as shown in the embodiments of FIGS. 4–6. During the manufacturing process, the circuit component 217 is attached to the substrate 224 with epoxy. The conductive pin 220 of the surface mount component 217 is then coupled to a conductive runner 228 with conductive adhesive 222, which is cured until the conductive pin 220 bonds adequately with the conductive runner 228. The heat seal connector 226 is then coupled to each conductive runner 228 of the substrate 224 and each corresponding conductive runner 206 of the display module 207 using a conventional heater. Although using a heat seal connector was disadvantageous in the prior art, this embodiment is advantageous in comparison, because the display module 207 and the PCB are integrated into the same unit, thereby eliminating stresses encountered from manual handling. It will be appreciated by those of ordinary skill in the art that other connectors suitable to the present invention (such as a ribbon connector) may be used.

Figure 8:
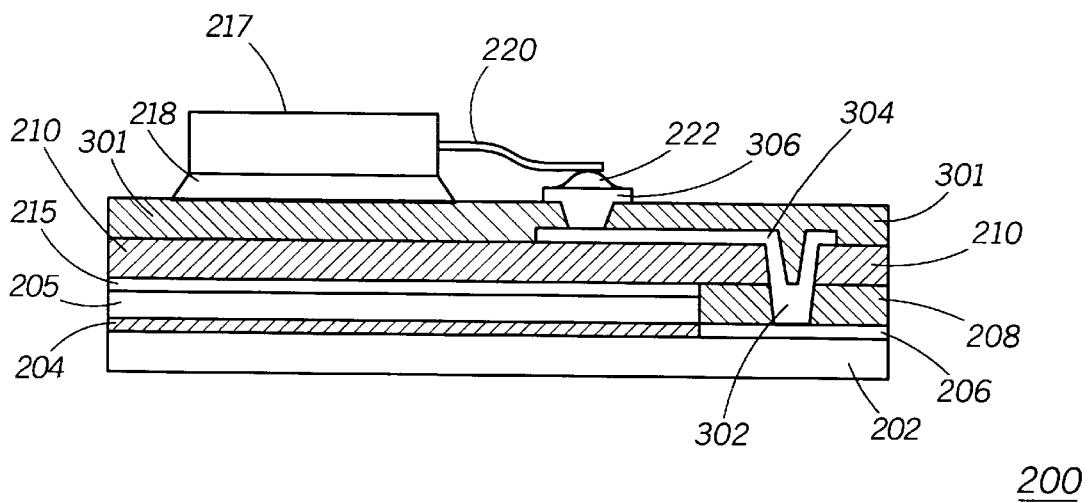
FIG. 8 shows a cross-sectional view of a surface mount component coupled to a conductive pad, which in turn couples to a conductive runner of a buried via which in turn couples to a conductive runner of the display module according to the present invention.

FIG. 8 shows a fourth embodiment according to the present invention. In this embodiment, a cross-sectional view is shown whereby the surface mount component 217 is coupled to a conductive pad 306 using a conductive adhesive 222 as discussed earlier. The conductive pad 306 is in turn coupled to a conductive runner 304 that connects to a buried via 302 coupled to one of the conductive runners 206 of the display module 207.

As this embodiment shows, three layers of substrate material 208, 210, 301 are used. The first two layers are deposited in the same manner as discussed for FIG. 4. The buried via 302 is constructed by removing a portion of the first two layers of substrate material 208, 210 and by depositing copper therein. The conductive runner 304 is then deposited in order to conductively couple the conductive pad 306 and the buried via 302 between the second and third substrate layers 210, 301. Once the conductive runner 304 has been constructed, the third layer of substrate material 301 is deposited upon the second layer 210. Another cavity is then removed from the third layer of substrate material 301 so that a portion of the conductive runner 304 is exposed. Copper is then deposited in the cavity to form the conductive pad 306.

Figure 9:
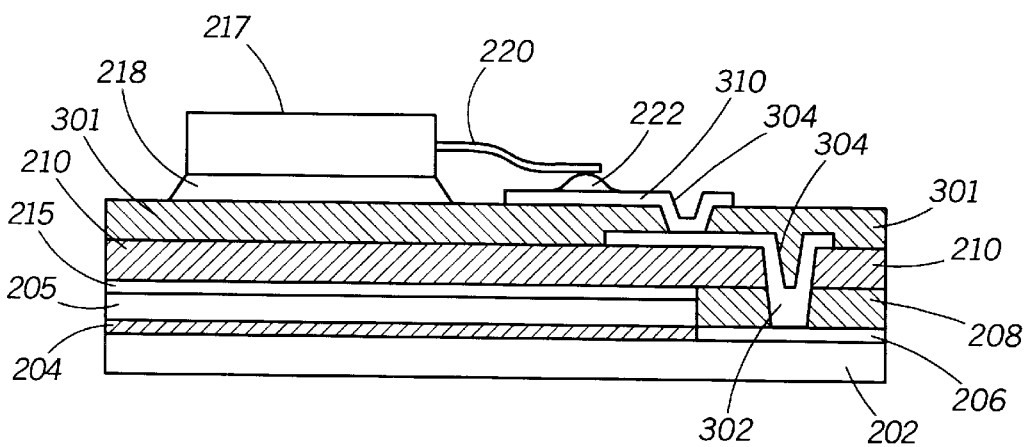
FIG. 9 shows a cross-sectional view of an alternative embodiment of FIG. 8, whereby a surface mount component is coupled to a conductive pad, which in turn couples to a conductive runner of a blind via which in turn couples to a buried via that couples to a conductive runner of the display module according to the present invention.

FIG. 9 shows a cross-sectional view of an alternative embodiment of FIG. 8. In this embodiment, the conductive pad 306 is replaced with a blind via 308 and a conductive runner 310 connected thereto. The conductive runner 310 is then coupled to the surface mount component 217 in a similar manner as described for FIG. 8. The blind vias are preferably constructed with high density interconnect technologies such as photo-imaged, plasma-etched, or laser drilled techniques.

It will be appreciated by one of ordinary skill in the art that more substrate layers than shown in the embodiments of FIGS. 8–9 may be used for adding a greater density of circuit components onto the backside of the display module 207. It will be further appreciated that any other types of components, be it electrical, electrical-mechanical, or simply mechanical components, may be used in the present invention for any of the embodiments shown in FIGS. 5–9.

Figure 10:
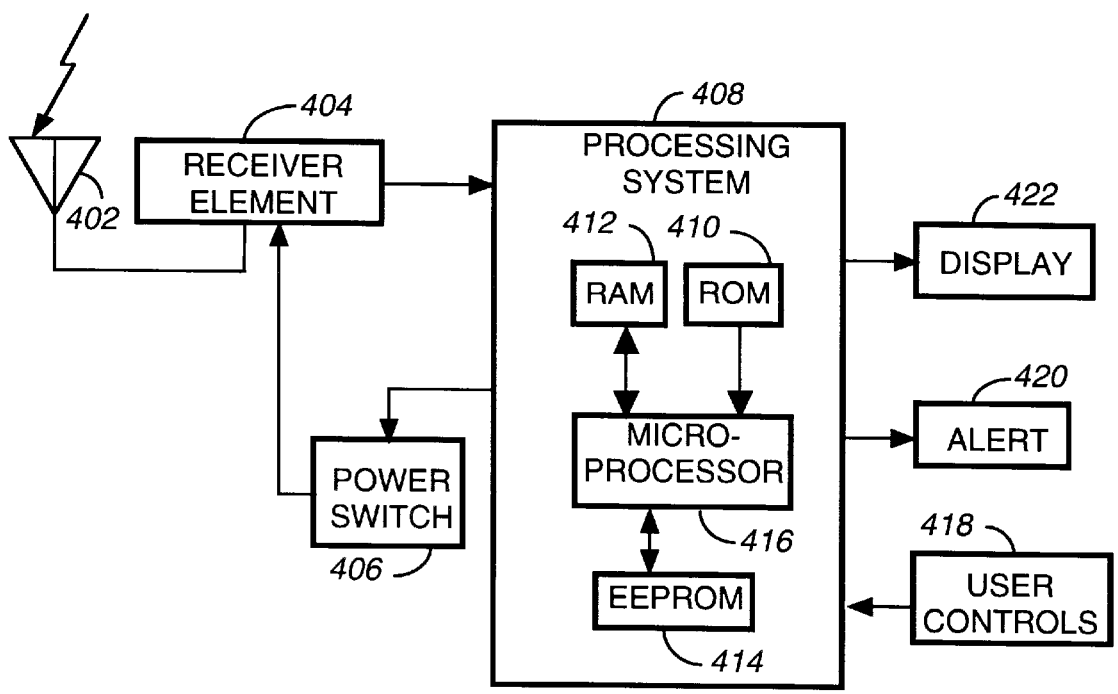
FIG. 10 shows an electrical block diagram of a selective call receiver utilizing the display module of the present invention.

FIG. 10 shows an electrical block diagram of an SCR (selective call receiver) 400 that takes advantage of any one of the embodiments of the display module 207 shown in FIGS. 5–9 according to the present invention. The SCR 400 comprises an antenna 402 for intercepting RF signals from, for example, a radio communication system (not shown). The antenna 402 is coupled to a receiver element 404 employing conventional demodulation techniques for receiving communication signals transmitted by a radio communication system. Radio signals received by the receiver element 404 produce demodulated information, which is coupled to a processing system 408 for processing received messages. A conventional power switch 406, coupled to the processing system 408, is used to control the supply of power to the receiver element 404, thereby providing a battery saving function.

To perform the necessary functions of the SCR 400, the processing system 408 includes a microprocessor 416, a random access memory (RAM) 412, a read-only memory (ROM) 410, and an electrically erasable programmable read-only memory (EEPROM) 414. Preferably, the processing system 408 is similar to the M68HC08 micro-controller manufactured by Motorola, Inc. It will be appreciated that other similar processors can be utilized for the processing system 408, and that additional processors of the same or alternative type can be added as required to handle the processing requirements of the processing system 408. It will be further appreciated that the RAM 412 and the ROM 410, singly or in combination, can be manufactured as an integral portion of the microprocessor 416.

The processing system 408 is programmed by way of the ROM 410 to process incoming messages transmitted by the radio communication system. The processing system 408 decodes an address in the demodulated data of the received message, compares the decoded address with one or more addresses stored in the EEPROM 414, and when a match is detected, proceeds to process the remaining portion of the message. Once the processing system 408 has processed the message, it stores the message in the RAM 412, and a call alerting signal is generated to alert a user that a message has been received. The call alerting signal is directed to a conventional audible or tactile alerting device 420 for generating an audible or tactile call alerting signal.

The message can be accessed by the user through user controls 418, which provide functions such as lock, unlock, delete, read, etc. More specifically, by the use of appropriate functions provided by the user controls 418, the message is recovered from the RAM 412, and conveyed to the user by way of the displayable portion 422 of the display module 207. It will be appreciated that additionally an audio circuit (not shown) may also be used for conveying voice messages.

The circuit components 402–422 of the SCR 400 are preferably an integral part of the display module 207 using any one of the embodiments described for FIGS. 5–9. By utilizing one of the embodiments of FIGS. 5–9, the circuit components 402–422 of an SCR 400 may be manufactured reliably since there are no loose components that can be subjected to stresses while the display module 207 is being manually inserted into a housing enclosure (not shown) of the SCR 400. Additionally, by integrating the circuit components 402–422 of the SCR 400 with the display module 207, the form factor of the housing enclosure can be constructed to be more compact than what prior art systems can provide.

Although the invention has been described in terms of a preferred embodiment it will be obvious to those skilled in the art that many alterations and variations may be made without departing from the invention. Accordingly, it is intended that all such alterations and variations be considered as within the spirit and scope of the invention as defined by the appended claims.

What is claimed is:

1. A method, comprising:
adding at least one layer of substrate material to a backside of a display module;
removing a portion of the at least one layer of substrate material to expose a portion of a first conductive runner located on the backside of the display module, wherein the first conductive runner is coupled to a displayable element of the display module; and
adding to the portion of the first conductive runner a first conductive coupling element,
wherein the first conductive coupling element comprises a first conductive pad, and wherein the method further comprises affixing a circuit component to the first conductive pad; and
wherein affixing the circuit component to the first conductive pad comprises:
adjoining the circuit component to the at least one layer of substrate material with an adhering material; and
wire bonding a second conductive pad of the circuit component to the first conductive pad.

2. A method, comprising:
adding at least one layer of substrate material to a backside of a display module;
removing a portion of the at least one layer of substrate material to expose a portion of a first conductive runner located on the backside of the display module, wherein the first conductive runner is coupled to a displayable element of the display module; and
adding to the portion of the first conductive runner a first conductive coupling element,
wherein the first conductive coupling element comprises a first conductive pad, and wherein the method further comprises affixing a circuit component to the first conductive pad; and
wherein affixing the circuit component to the first conductive pad comprises:
adjoining with a conductive adhesive a conductive pin of the circuit component to the first conductive pad; and
curing the conductive adhesive until the conductive pin and the first conductive pad have made an adequate electrical bond.

3. A method, comprising:
adding at least one layer of substrate material to a backside of a display module;
removing a portion of the at least one layer of substrate material to expose a portion of a first conductive runner located on the backside of the display module, wherein the first conductive runner is coupled to a displayable element of the display module; and
adding to the portion of the first conductive runner a first conductive coupling element, wherein the first conductive coupling element comprises a first via.

4. A method, comprising:
adding at least one layer of substrate material to a backside of a display module;
removing a portion of the at least one layer of substrate material to expose a portion of a first conductive runner located on the backside of the display module, wherein the first conductive runner is coupled to a displayable element of the display module;
adding to the portion of the first conductive runner a first conductive coupling element, wherein the first conductive coupling element comprises a first via;

adding a second conductive runner to an end of the first via;

adding an additional layer of substrate material to the backside of the display module;

removing a portion of the additional layer of substrate material to expose a portion of the second conductive runner; and adding to the portion of the second conductive runner a second conductive coupling element.

5. The method as recited in claim 4, wherein the second conductive coupling element comprises a first conductive pad, and wherein the method further comprises affixing a circuit component to the first conductive pad.

6. The method as recited in claim 5, wherein affixing the circuit component to the first conductive pad comprises:

adjoining the circuit component to the additional layer of substrate material with an adhering material; and wire bonding a second conductive pad of the circuit component to the first conductive pad.

7. The method as recited in claim 6, wherein affixing the circuit component to the first conductive pad comprises:

adjoining with a conductive adhesive a conductive pin of the circuit component to the first conductive pad; and curing the conductive adhesive until the conductive pin and the first conductive pad have made an adequate electrical bond.

8. The method as recited in claim 4, wherein the second conductive coupling element comprises a second via.

9. A display module, comprising:

a displayable element;

a first conductive runner located on a backside of the display module that couples to the displayable element;

at least one layer of substrate material covering the backside of the display module with a portion of the first conductive runner exposed; and a first conductive coupling element coupled to the portion of the first conductive runner, wherein the display module further comprises:

front and back plates, the displayable element coupled between the front and back plates;

a liquid crystal material coupled between the front and back plates; and a panel coupled to a side of the back plate opposite to the side where the displayable element is positioned, wherein the panel comprises:

a display enhancement panel for enhancing visibility of the displayable element as seen from the front plate; and a receptor panel for receiving the at least one layer of substrate material.

10. A selective call receiver comprising the display module of claim 9.

11. A display module, comprising:

a displayable element;

a first conductive runner located on a backside of the display module that couples to the displayable element;

at least one layer of substrate material covering the backside of the display module with a portion of the first conductive runner exposed; and a first conductive coupling element coupled to the portion of the first conductive runner, wherein the first conductive coupling element comprises a first conductive pad, and wherein the display module further comprises a circuit component coupled to the first conductive pad;

wherein the circuit component is coupled to the at least one layer of substrate material with an adhering material; and wherein a second conductive pad of the circuit component is wire bonded to the first conductive pad.

12. A display module, comprising:

a displayable element;

a first conductive runner located on a backside of the display module that couples to the displayable element;

at least one layer of substrate material covering the backside of the display module with a portion of the first conductive runner exposed; and a first conductive coupling element coupled to the portion of the first conductive runner, wherein the first conductive coupling element comprises a first conductive pad, and wherein the display module further comprises a circuit component coupled to the first conductive pad, and wherein a conductive pin of the circuit component is coupled to the first conductive pad with a conductive adhesive.

13. A selective call receiver comprising the display module of claim 12.

14. A display module, comprising:

a displayable element;

a first conductive runner located on a backside of the display module that couples to the displayable element;

at least one layer of substrate material covering the backside of the display module with a portion of the first conductive runner exposed; and a first conductive coupling element coupled to the portion of the first conductive runner, wherein the first conductive coupling element comprises a first via.

15. A display module, comprising:

a displayable element;

a first conductive runner located on a backside of the display module that couples to the displayable element;

at least one layer of substrate material covering the backside of the display module with a portion of the first conductive runner exposed;

a first conductive coupling element coupled to the portion of the first conductive runner, wherein the first conductive coupling element comprises a first via;

a second conductive runner coupled to an end of the first via;

an additional layer of substrate material coupled to the at least one layer of substrate material with a portion of the second conductive runner exposed; and a second conductive coupling element coupled to the portion of the second conductive runner.

16. The display module as recited in claim 15, wherein the second conductive coupling element comprises a first conductive pad, and wherein the display module further comprises a circuit component coupled to the first conductive pad.

17. The display module as recited in claim 16, wherein the circuit component is coupled to the additional layer of substrate material with an adhering material; and wherein a second conductive pad of the circuit component is wire bonded to the first conductive pad.

18. The display module as recited in claim 17, wherein a conductive pin of the circuit component is coupled to the first conductive pad with a conductive adhesive.

19. The display module as recited in claim 15, wherein the second conductive coupling element comprises a blind via.

* * * * *